US 7,557,724 B2

(12) United States Patent
Breitling et al.

(10) Patent No.: US 7,557,724 B2
(45) Date of Patent: Jul. 7, 2009

(54) DEVICE FOR DETECTING A FAULT CURRENT IN AN ELECTRONIC APPARATUS

(75) Inventors: Wolfram Breitling, Sachensheim (DE); Jacek Mendes, Leonberg (DE); Andrea Goeggelmann, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 458 days.

(21) Appl. No.: 11/484,378

(22) Filed: Jul. 10, 2006

(65) Prior Publication Data

US 2007/0159741 A1    Jul. 12, 2007

(30) Foreign Application Priority Data

Jul. 15, 2005    (DE) .................. 10 2005 033 135

(51) Int. Cl.
*G08B 21/00*    (2006.01)
(52) U.S. Cl. .................. 340/650; 340/635; 340/638; 340/651; 340/661; 361/86
(58) Field of Classification Search .......... 340/635, 340/638, 647, 649–654, 657–664, 568.2; 361/42, 54, 56, 78, 86, 88
See application file for complete search history.

(56) References Cited

U.S. PATENT DOCUMENTS

| 3,808,534 | A | * | 4/1974 | Summers et al. | ............ 340/517 |
| 4,291,302 | A | * | 9/1981 | King et al. | .................. 340/642 |
| 4,634,971 | A | * | 1/1987 | Johnson et al. | ............. 324/133 |
| 5,159,517 | A | | 10/1992 | Bodkin | |
| 5,973,896 | A | * | 10/1999 | Hirsh et al. | .................... 361/54 |
| 7,352,547 | B2 | * | 4/2008 | Okushima | .................... 361/56 |
| 2008/0204951 | A1 | * | 8/2008 | Hull | ............................ 361/49 |

* cited by examiner

*Primary Examiner*—Toan N Pham
*Assistant Examiner*—Travis R Hunnings
(74) *Attorney, Agent, or Firm*—Kenyon & Kenyon LLP

(57) ABSTRACT

A device for detecting a fault current in an electronic apparatus has a first and at least one second electric conductor, the first electric conductor carrying a first electric potential and the at least one second electric conductor carrying a second electric potential. The device is characterized by the fact that an electric sensing conductor having a fixed electric rest potential whose value lies between the first and the at least one second electric potential is situated between the electric conductors.

9 Claims, 3 Drawing Sheets

DEVICE FOR DETECTING A FAULT CURRENT IN AN ELECTRONIC APPARATUS

FIELD OF THE INVENTION

The present invention relates to a device for detecting a fault current in an electronic apparatus.

BACKGROUND INFORMATION

When used in motor vehicles, in particular, an ever-present supply potential, combined with temperature and moisture influences as well as ion-supplying substances such as de-icing salt, wiper fluid surfactants or plastic additives, may result in corrosion of contact materials, degradation of plastics or migration on printed circuit boards, producing conductive paths having unwanted cross or fault currents. Over time, these paths become increasingly less resistant, so that the fault currents rise and any surrounding plastic parts may overheat or ignite. However, since the fault currents are often below the response threshold of automotive. fuses, it is not possible to detect and avoid them, in particular in the case of continuous plus wires, by activating the automotive fuses or by interrupting the connection to the battery via an ignition key.

An electric consumer, which is connectable to an a.c. voltage via a connector and two supply lines and has a sensing conductor and a detector circuit for detecting a fault current due to low-resistance shorting of the electric consumer produced by water or another conductive liquid, is known from U.S. Pat. No. 5,159,517. The connector also accommodates an interrupter circuit which interrupts the two supply lines if an overcurrent is detected. The detector circuit may be situated in either a housing of the electric consumer or in the connector, the sensing conductor in the latter case being run from the electric consumer to the connector, together with the two supply lines, as a third conductor.

Another known method for detecting and avoiding fault currents in power networks involves the use of fault current circuit breakers which cut off the entire power supply in the event of a fault. However, it is not possible to use a procedure of this type in motor vehicles, since this may result in dangerous, undefined operating states. Furthermore, there is no need for this, since the vehicle voltage is usually below the level of the safety extra-low voltage.

SUMMARY OF THE INVENTION

The device according to the present invention for detecting a fault current in an electronic apparatus, having a first and at least one second electric conductor, the first electric conductor carrying a first electric potential and the at least one second electric conductor carrying a second electric potential, has the advantage over the related art that it provides a very safe, simple and cost-effective means of detecting fault current paths or fault currents at an early stage and therefore in a timely manner. For this purpose, an electric sensing conductor having a fixed electric rest potential, the value of which lies between the first and the at least one second electric potential, is situated between the electric conductors.

The rest potential of the sensing conductor is derived, in principle, from the mean value of the first and second electric potentials. In this manner, in the event of a fault, an evaluation circuit, a microprocessor and/or a threshold switch may very easily and unambiguously detect a shift in the electric rest potential of the sensing conductor in the direction of the first or the second electric potential.

Since the device according to the present invention is able to detect faults at a very early stage, it is also advantageous that, to avoid undefined states of the electronic apparatus, the evaluation circuit, the microprocessor and/or the threshold switch emit(s) a warning signal upon detection of a fault, the device being designed in such a way that the electronic apparatus is not deactivated.

The device according to the present invention is used in a particularly advantageous manner in connection with printed circuit boards, plastics having integrated or deposited conductive tracks, contact means and/or lead frames. In this regard, the first electric conductor, the at least one second electric conductor and/or the sensing conductor is/are designed as conductor tracks, contacts and/or lead frame tracks.

DETAILED DESCRIPTION

Figure 1:
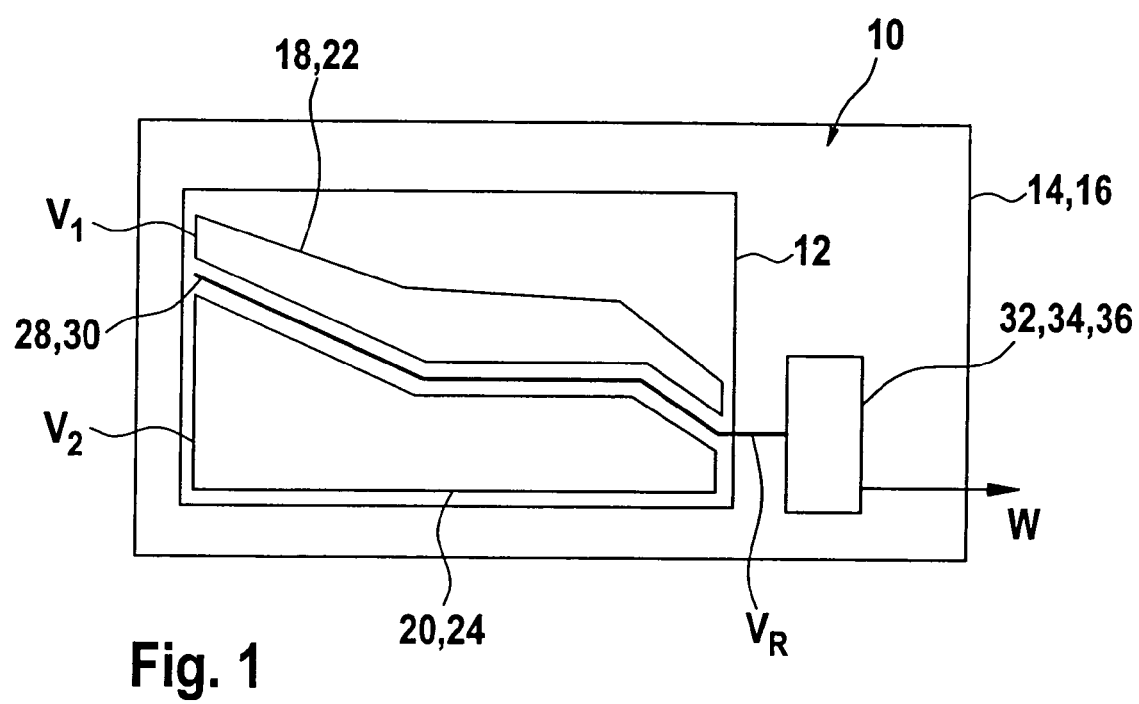
FIG. 1 shows a first exemplary embodiment of the device according to the present invention for a printed circuit board.

FIG. 1 shows a first exemplary embodiment of device 10 according to the present invention. A first electric conductor 18 and a second electric conductor 20 are deposited in the form of a first conductor track 22 and a second conductor track 24 onto a printed circuit board (PCB) 12 of an electronic apparatus 14, for example a motor vehicle control unit 16. While first conductor track 22 carries a first electric potential $V_1$, second conductor track 24 is connected to a second electric potential $V_2$. Since the two conductor tracks 22 and 24 thus have different potentials, a low-resistance short between them must be avoided. However, a fault—caused, for example, by saline spray water, wiper fluid surfactants or dissolved plastic additives—resulting in ionic migration involving corrosion or migration of conductor tracks 22, 24 or in a degradation of the plastics causes unwanted cross or fault currents which may produce substantial heating or ignition of the plastic parts. In the case of motor vehicle control unit 16, this even poses the danger of the vehicle catching fire, since it is not possible to interrupt the connection via a vehicle key, in particular in the case of a permanent plus connection between first conductor track 22 and the positive pole of a battery 26 illustrated in FIG. 2. Moreover, since cross or fault currents often lie below the response threshold of automotive fuses, such fuses are also unable to provide adequate protection.

For this reason, according to the present invention, a sensing conductor 28, which in the case of printed circuit board 12 is also designed as a conductor track 30, is provided between susceptible conductor tracks 22, 24. Sensing conductor 28 is connected to an evaluation circuit 32, a microprocessor 34 and/or a threshold switch 36 and has a fixed electric rest potential $V_R$, the value of which lies between first electric potential $V_1$ and second electric potential $V_2$. This value may, in principle, be formed from the mean value (arithmetic, geometric or the like) of first and second electric potentials $V_1$ and $V_2$. If, in the event of a fault, a conductive path occurs between first and second conductor tracks 22, 24, rest potential $V_R$ of sensing conductor 28 shifts in the direction of either first electric potential $V_1$ or second electric potential $V_2$. This potential variation is detected by evaluation circuit 32, microprocessor 34 and/or threshold switch 36, and a warning signal W is emitted. Since the evaluation is highly resistive, warning signal W is emitted far in advance of an actual endangerment caused by critical, low-resistance states. To additionally avoid the danger of undefined states—in particular during the operation of a motor vehicle—device 10 is designed in such a way that it is unable to deactivate electronic apparatus 14 in the event of a fault. Intervention into faulty electronic apparatus 14 therefore takes place later on in a repair shop without endangering the vehicle occupants.

Figure 2:
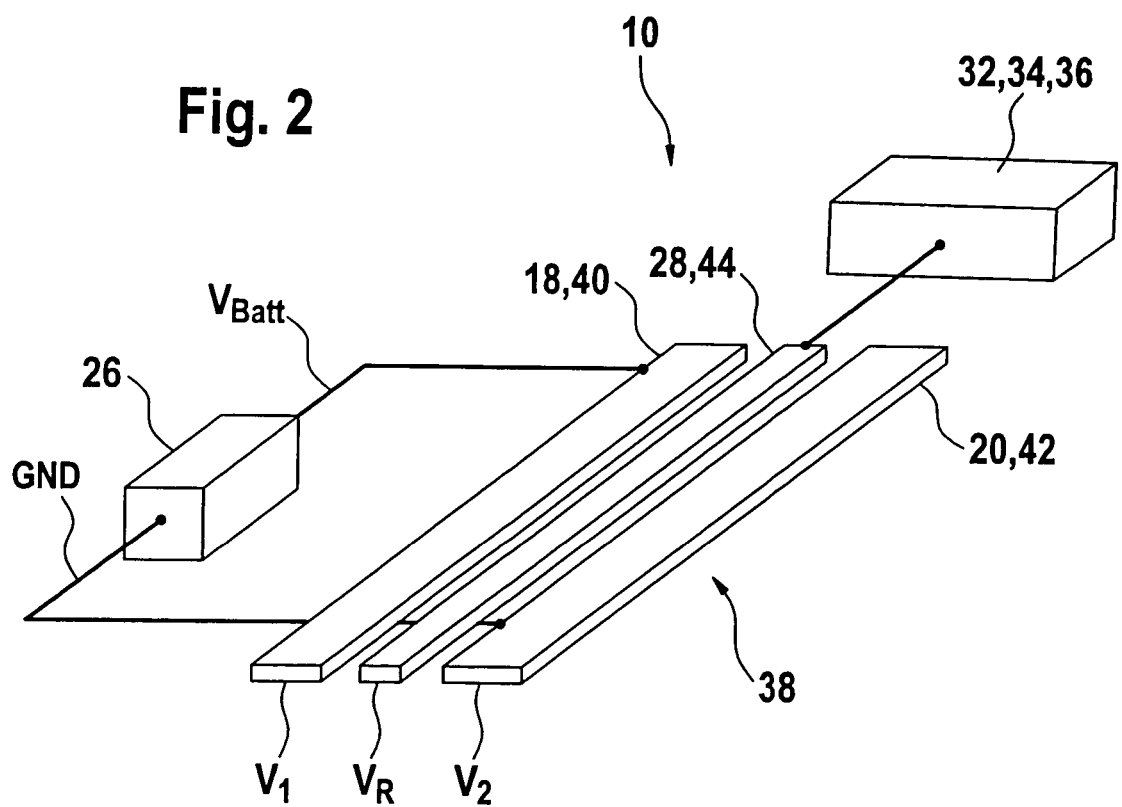
FIG. 2 shows a second exemplary embodiment of the device according to the present invention for a lead frame.

FIG. 2 shows a second exemplary embodiment of device 10 according to the present invention to detect a fault current for a preferably plastic-coated lead frame 38. First conductor 18 designed as lead frame track 40 and second conductor 20 designed as lead frame track 42 are connected to a supply potential $V_{batt}$ and a ground potential GND of battery 26, respectively, so that first electric potential $V_1$ of first electric conductor 18 corresponds to supply potential $V_{batt}$, and second electric potential $V_2$ corresponds to ground potential GND. With reference to FIG. 1, lead frame tracks 40 and 42 in this case also form integral parts of electronic apparatus 14. In the case of motor vehicle control unit 16, lead frame tracks 40, 42 may be used, for example, to supply power to power components or high-current consumers, which are not illustrated.

Sensing conductor 28, which is also in the form of lead frame track 44, is situated between lead frame tracks 40, 42 and connected to evaluation circuit 32, microprocessor 34 and/or threshold switch 36. As illustrated in FIG. 1 above, sensing conductor 28 in this case also carries a fixed rest potential $V_R$, the value of which—in particular the mean value—lies between first and second electric potentials $V_1$ and $V_2$. Because both the detection and warning of fault currents are carried out as described for FIG. 1, they are not discussed in any further detail here.

Figure 3:
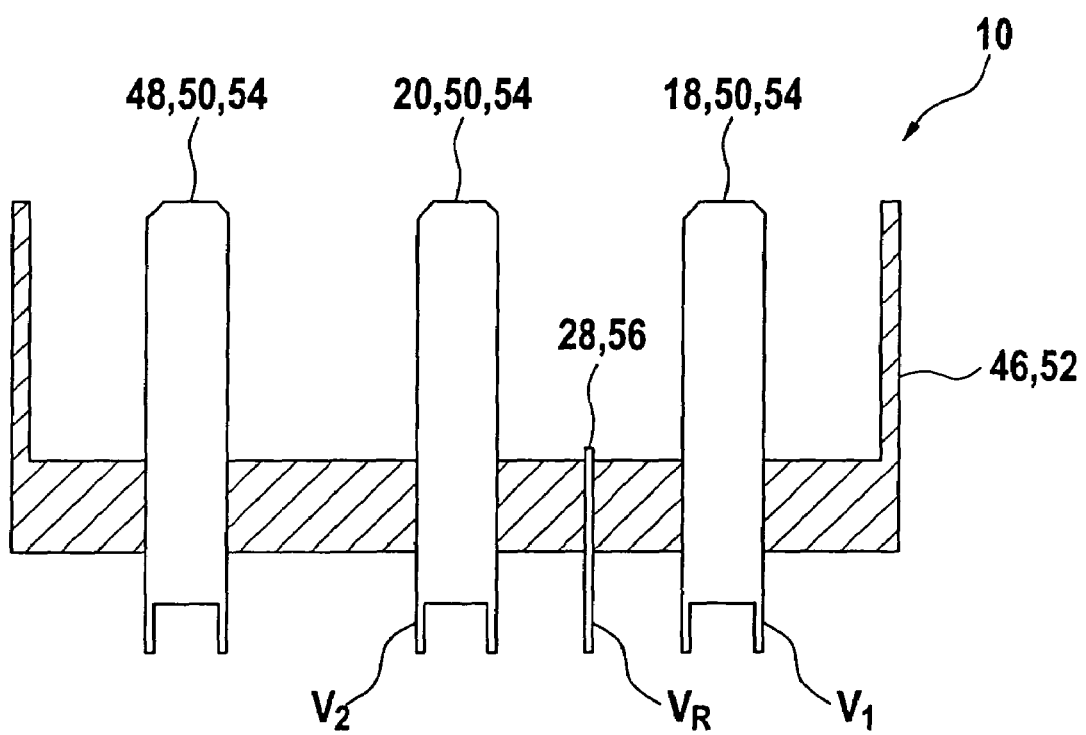
FIG. 3 shows a third exemplary embodiment of the device according to the present invention for a contact means.

FIG. 3 shows a third exemplary embodiment of device 10 according to the present invention for a contact means 46, first conductor 18, second conductor 20 and a further conductor 48 being designed as injected or inserted contacts 50. If contact means 46 is, for example, a connector 52, contacts 50 are contact pins 54. In the case of a socket (not illustrated), contacts 50 may also be designed as contact receptacles.

First and second potential $V_1$ and $V_2$ may be applied to contacts 50 via a connection to battery 26, or potentials $V_1$ and $V_2$ may be applied thereto only by inserting contacts 50 into a receptacle provided for them, but not illustrated. Moisture penetrating contact means 46, a degradation of plastic or the like may produce a low-resistance short and thus a fault current between first electric conductor 18 and second electric conductor 20. To enable this fault current to be detected at an early stage, contact means 46 has sensing conductor 28 between the two conductors 18 and 20 in the form of an integrally cast or inserted pin 56. As shown in FIGS. 1 and 2 above, this pin is connected to evaluation circuit 32, microprocessor 34 and/or threshold switch 36 via a line (not illustrated) and provided with a fixed rest potential $V_R$, the value of which—in particular, the mean value—lies between first and second electric potentials $V_1$ and $V_2$. As a result of the shift in rest potential $V_R$ in the direction of first or second electric potential $V_1$ or $V_2$, produced by one of the aforementioned influences, it is thus possible to detect fault currents at an early stage using evaluation circuit 32, microprocessor 34 and/or threshold switch 36. According to this exemplary embodiment, a warning signal W is emitted upon detection of a fault, and device 10 is designed in such a way that it does not deactivate the electronic apparatus connected to contact means 46 in order to avoid undefined states which may pose a safety risk, for example in a motor vehicle.

In conclusion, note that the illustrated exemplary embodiments are not limited to FIGS. 1 through 3 or to the arrangement, shape or number of conductors or sensing conductors. It is therefore entirely conceivable for lead frame 38 shown in FIG. 2 to have a sensing conductor 28 in the form of a conductor track, a flexible line or the like. The same applies to the two other exemplary embodiments illustrated here. It is also possible to use an appropriately designed sensing conductor 28 in a cable or a cable harness so that the protective means extends from electronic apparatus 14 via the cable harness to contact means 46, and additional actuators and/or sensors connected to the cable harness may be included in the fault current detection function.

What is claimed is:

1. A device for detecting a fault current in an electronic apparatus, comprising:
   a first conductor having a first potential;
   at least one second electric conductor having at least one second potential, the first electric conductor carrying a first electric potential and the at least one second electric conductor carrying at least one second electric potential; and
   an electric sensing conductor situated between the first conductor and the at least one second conductor, wherein the electric sensing conductor includes an electric rest potential whose value lies between the first potential and the at least one second potential, the electric rest potential being fixed in the absence of a fault.

2. The device as recited in claim 1, wherein the electric rest potential is derived, in principle, from a mean value of the first potential and the at least one second potential.

3. The device as recited in claim 1, further comprising:
   an element including at least one of an evaluation circuit, a microprocessor, and a threshold switch, wherein the element is configured to detect, in the event of a fault, a shift in the electric rest potential in a direction of one of the first potential and the at least one second potential.

4. The device as recited in claim 3, wherein:
   the element is configured to emit a warning signal upon detection of the fault, the device being designed in such a way that the electronic apparatus is not deactivated.

5. The device as recited in claim 1, wherein:
   at least one of the first electric conductor, the at least one second electric conductor, and the electric sensing conductor includes a conductor track of a printed circuit board.

6. The device as recited in claim 1, wherein:
   at least one of the first electric conductor, the at least one second electric conductor, and the electric sensing conductor includes a contact of a contact element.

7. The device as recited in claim 1, wherein:
   at least one of the first electric conductor, the at least one second electric conductor, and the electric sensing conductor includes a track of a lead frame.

8. The device as recited in claim 1, wherein:
   the first potential is a supply potential, and
   the at least one second potential is a ground potential of a battery.

9. The device as recited in claim 1, wherein the electronic apparatus is a motor vehicle control unit.

* * * * *